United States Patent [19]
Moore

[11] Patent Number: 6,110,289
[45] Date of Patent: Aug. 29, 2000

[54] RAPID THERMAL PROCESSING BARREL REACTOR FOR PROCESSING SUBSTRATES

[75] Inventor: Gary M. Moore, Monte Sereno, Calif.

[73] Assignee: Moore Epitaxial, Inc., San Jose, Calif.

[21] Appl. No.: 08/806,558

[22] Filed: Feb. 25, 1997

[51] Int. Cl.[7] .............................. C23C 16/00; F27B 5/00; F27B 5/14; F27B 5/18

[52] U.S. Cl. ........................ 118/725; 118/724; 118/728; 118/730; 118/666; 219/390; 219/391; 219/406; 219/411; 392/407; 392/411; 392/416; 392/418; 432/9; 432/200; 432/202; 432/254.2; 427/248.1

[58] Field of Search .................................. 118/724, 725, 118/728, 730, 663, 666; 219/390, 391, 406, 411; 392/407, 411, 416, 418; 432/9, 31, 200, 202, 203, 254.2; 427/248.1

[56] References Cited

U.S. PATENT DOCUMENTS

| | | | |
|---|---|---|---|
| Re. 33,326 | 9/1990 | Ebata et al. .......................... | 118/697 |
| 3,796,182 | 3/1974 | Rosler ..................................... | 118/725 |
| 4,081,313 | 3/1978 | McNeilly et al. ...................... | 156/610 |
| 4,496,609 | 1/1985 | McNeilly et al. ...................... | 427/55 |
| 4,823,736 | 4/1989 | Post et al. .............................. | 118/730 |
| 4,858,557 | 8/1989 | Pozzetti et al. ........................ | 118/725 |
| 5,053,247 | 10/1991 | Moore ...................................... | 427/55 |
| 5,207,835 | 5/1993 | Moore ..................................... | 118/725 |
| 5,288,364 | 2/1994 | Burt et al. ............................... | 156/601 |
| 5,444,217 | 8/1995 | Moore et al. ........................... | 219/405 |
| 5,580,388 | 12/1996 | Moore ..................................... | 118/728 |

FOREIGN PATENT DOCUMENTS

| | | | |
|---|---|---|---|
| 62-76719 | 4/1987 | Japan .................................... | 118/725 |
| 61-210622 | 9/1996 | Japan .................................... | 118/730 |

*Primary Examiner*—R. Bruce Breneman
*Assistant Examiner*—Jeffrie R Lund
*Attorney, Agent, or Firm*—Forrest Gunnison

[57] ABSTRACT

A novel rapid thermal process (RTP) barrel reactor processes a larger batch of semiconductor substrates than was previously possible. The RTP barrel reactor is characterized by a short process cycle time in comparison to the same process cycle time in a conventional CVD barrel reactor. A rapid heat-up of the substrates is one of the keys to the shorter process cycle times of the RTP barrel reactor. The RTP barrel reactor utilizes a radiant heat source in combination with a heat controller that includes an open-loop controller for heat-up and a closed-loop controller for deposition as well as a new energy stabilizer to achieve heating a larger energy stabilizer and volume to a uniform processing temperature in times characteristic of RTP reactors.

27 Claims, 9 Drawing Sheets

RAPID THERMAL PROCESSING BARREL REACTOR FOR PROCESSING SUBSTRATES

BACKGROUND OF THE INVENTION

1. Field of the Invention

This invention relates in general to processing substrates, and, in particular, to a method and apparatus for simultaneous rapid thermal processing of a plurality of substrates, such as semiconductor wafers.

2. Description of Related Art

Deposition of a film on the surface of a semiconductor substrate is a common step in semiconductor processing. Typically, selected chemical gases are mixed in a deposition chamber containing the semiconductor substrate. Usually, heat is applied to drive the chemical reaction of the gases in the chamber and to heat the surface of the substrate on which the film is deposited.

In deposition processes, it is desirable to maximize substrate throughput, i.e., the number of substrates processed per unit time, while depositing film layers that have uniform properties, e.g., uniform thickness and resistivity for an epitaxial layer. To obtain uniform properties of a deposited film, it is important to maintain the substrate at a uniform temperature during deposition.

A number of different deposition reactors have been developed. Generally, each deposition reactor has a reaction chamber, a substrate handling system, a heat source and temperature control, and a gas delivery system (inlet, exhaust, flow control).

Deposition reactors may be classified according to characteristics of their operation. For instance, a reactor may be either a cold wall or a hot wall reactor. Cold wall reactors are usually preferred because undesirable deposits do not build up on the reaction chamber walls.

A reactor may also be characterized by the amount of time that is required to heat-up, process, and cool-down the substrate. Conventional non-RTP CVD reactors take on the order of 40 to 90 minutes for a complete process cycle of a batch of substrates. An important aspect in obtaining uniform depositions in conventional non-RTP CVD reactors is that the susceptor function as a thermal flywheel. See for example, U.S. Pat. Nos. 4,081,313 and 4,496,609 and the prosecution history for these patents that is publicly available from the U.S. Patent and Trademark Office. A susceptor that functions as a thermal flywheel has a large thermal mass and consequently requires a significant time period to heat that mass to the operating temperature and similarly a significant time to cool that mass to an ambient temperature.

In contrast, rapid thermal process (RTP) reactors typically require only 2 to 15 minutes to process a substrate and consequently cannot utilize the massive susceptors of the conventional CVD reactors. Rapid thermal reactors are characterized by the fact that the process cycle time is significantly less that the process cycle time for a conventional CVD reactor.

Conventional non-RTP CVD reactors have been used to process a plurality of substrates in one batch. See for example, U.S. Pat. No. 5,053,247, entitled "Method for Increasing the Batch Size of a Barrel Epitaxial Reactor and Reactor Produced Thereby," of Gary M. Moore issued on Oct. 1, 1991 and U.S. Pat. No. 5,207,835, entitled "High Capacity Epitaxial Reactor," of Gary M. Moore issued on May 4, 1993, each of which is incorporated herein by reference in its entirety.

RTP reactors have been used to process single substrate batches and also a plurality of substrates in a single batch. See for example, U.S. patent application Ser. No. 08/185,691 entitled "A RAPID THERMAL PROCESSING APPARATUS FOR PROCESSING SEMICONDUCTOR WAFERS," of Gary M. Moore and Katsuhito Nishikawa filed on Jan. 21, 1994, now U.S. Pat. No. 5,683,518, and U.S. patent application Ser. No. 08/007,981 entitled "A RAPID THERMAL PROCESSING APPARATUS FOR PROCESSING SEMICONDUCTOR WAFERS," of Gary M. Moore and Katsuhito Nishikawa filed on Jan. 21, 1993, now U.S. Pat. No. 5,444,217, each of which is incorporated herein by reference in its entirety.

While both substrate size and substrate throughput have increased over the years for rapid thermal processing, the multiple substrate batch sizes in an RTP reactor are less than the batch sizes of a conventional non-RTP CVD barrel reactor for a given substrate diameter. To further reduce the per die cost of RTP, larger RTP batch sizes are required. However, making a larger volume RTP reactor, requires heating of that larger volume to an approximately uniform state prior to initiating processing. This would increase the cycle time not only due to the longer heat-up time, but also due to the increased thermal flywheel effect associated with the larger volumes.

In addition, processing larger batch sizes requires a larger susceptor. However, constructing a large susceptor is problematic due to the inherent thermal flywheel affects of a larger susceptor. Thus, a way is needed to increase the batch size of RTP reactors while maintaining the short cycle times associated with RTP.

SUMMARY OF THE INVENTION

A novel rapid thermal process (RTP) barrel reactor of this invention processes a larger batch of semiconductor substrates than was previously possible. Herein, the RTP barrel reactor is characterized by a short process cycle time in comparison to the same process cycle time in a conventional CVD barrel reactor. The rapid heat-up of the substrates is one of the keys to the shorter process cycle times that characterize the RTP barrel reactor of this invention.

The RTP barrel reactor of this invention utilizes a radiant heat source in combination with a novel dual-mode heat controller and a novel energy stabilizer to overcome the prior art problems of heating a larger susceptor and volume to a uniform processing temperature in times characteristic of RTP reactors. The RTP barrel reactor of this invention processes a batch of 32 substrates having a diameter of 100 mm, a batch of 18 substrates having a diameter 125 mm, a batch of 15 substrates having a diameter 150 mm, a batch of 8 substrates having a diameter of 200 mm, a batch of 3 substrates having a diameter 250 mm, or alternatively a batch of 3 substrates having a diameter of 300 mm. While some of the batches sizes are similar to those of the prior art barrel reactors, the heat-up time for a batch has been reduced from 12 to 20 minutes for a conventional CVD barrel reactor to 2 to 5 minutes. Hence, many more substrates can be processed in a given time interval compared with the prior art barrel CVD reactors. This significantly enhances the throughput without requiring expenditures for additional reactors as would be required using the prior art barrel CVD reactors. Consequently, the cost per die is decreased.

In one embodiment, the heat-up of the RTP barrel reactor is controlled by an open-loop controller that ramps-up the power to the RTP radiant heat source using an empirical table that is power level vs. time. The open-loop controller does not impose any limitations on how the power to the RTP radiant heat source is ramped up. The time segments used can be of any desired length, and the power change over a time segment, as well as from time segment to time segment can be any desired magnitude.

The open-loop controller allows establishment of a number of different power ramp rates during initial heating of the substrates. In one embodiment of the invention, up to thirty different ramp rates can be used during initial heating by appropriately preprogramming the computer used to implement the open-loop controller. The power ramp rates used are determined empirically through a series of test runs of RTP barrel reactor, and are selected so as to maintain a substantially uniform temperature in each of the substrates and between substrates, and if appropriate to the process, to minimize slip within the substrate and to obtain uniform characteristics within the film.

During heat-up, as the temperature of the substrates increases, and reaches a level at which two temperature sensors within the reaction chamber operate accurately, the dual-mode RTP barrel reactor heat controller combines the two temperature signals to obtain a control temperature that is indicative of the average temperature of the substrates. In one embodiment, one of the temperature sensors is located within the energy stabilizer and the other is mounted near the top of the reaction chamber between the energy stabilizer and the reaction chamber wall.

The dual-mode heat controller compares the control temperature with a controller change temperature. The controller change temperature is a setpoint temperature, typically the operating temperature, minus a predefined temperature offset that compensates for the lag between the actual temperature in the reaction chamber and the temperatures generated by the temperature sensors. When the control temperature is equal to or greater than the controller change temperature, the dual-mode heat controller switches from the open-loop mode of operation to a closed-loop mode of operation for the actual deposition.

In the closed-loop mode of operation, the operating temperature may drift in a consistent reproducible matter from batch to batch. Thus, the dual mode heat controller includes the capability to adjust the control temperature using a preprogrammed ramp so that the closed-loop controller maintains the temperature approximately constant during deposition without the drift.

The extension of RTP to barrel reactors significantly enhances the throughput of substrates. Further, the principles of this invention can be used to build a completely new reactor, or alternatively to retro-fit an existing prior art CVD reactor for RTP operation.

DETAILED DESCRIPTION

According to the principles of this invention, a novel rapid thermal process (RTP) barrel reactor 100 processes a larger plurality of substrates, e.g., semiconductor wafers, than was previously possible in a RTP reactor while maintaining industry standards for deposition film quality. Herein, a RTP barrel reactor is a barrel reactor that has a process cycle time that is short compared to the same process cycle time in a conventional CVD barrel reactor.

RTP barrel reactor 100 of this invention heats the plurality of substrates at a rate between 5° C./sec and 400° C./sec, and in one embodiment, a rate between 5° C./sec and 20° C./sec. RTP barrel reactor 100 of this invention utilizes a novel low-mass energy stabilizer 165 and a radiant heat source 150 in combination with a dual-mode RTP barrel reactor heat controller (not shown) to achieve the combination of rapid heat-up and acceptable film quality. Typical batches sizes for RTP barrel reactor 100 are given in Table 1.

TABLE 1

Batch Capacity

| Substrate Diameter (mm) | Batch Size |
|---|---|
| 100 (4 inches) | 32 |
| 125 (5 inches) | 18 |
| 150 (6 inches) | 15 |
| 200 (8 inches) | 8 |

Hereafter, substrate sizes are indicated without explicitly stating that the dimension given is the diameter of the substrate. This batch capacity is significantly larger than one prior art RTP reactor that processed 150 mm (6 inches) substrates in batches of four substrates, and 200 mm (8 inches) substrates in batches of three substrates.

The increased batch size and deposition layer uniformity within industry standards are obtained with a RTP reaction chamber, a RTP heat source, and a RTP barrel reactor energy stabilizer which provide a unique set of conditions for RTP film growth, as explained more completely below. Since RTP barrel reactor 100 of this invention deposits layers within industry quality standards for increased batch sizes, processing cost per substrate is reduced.

Figure 1:
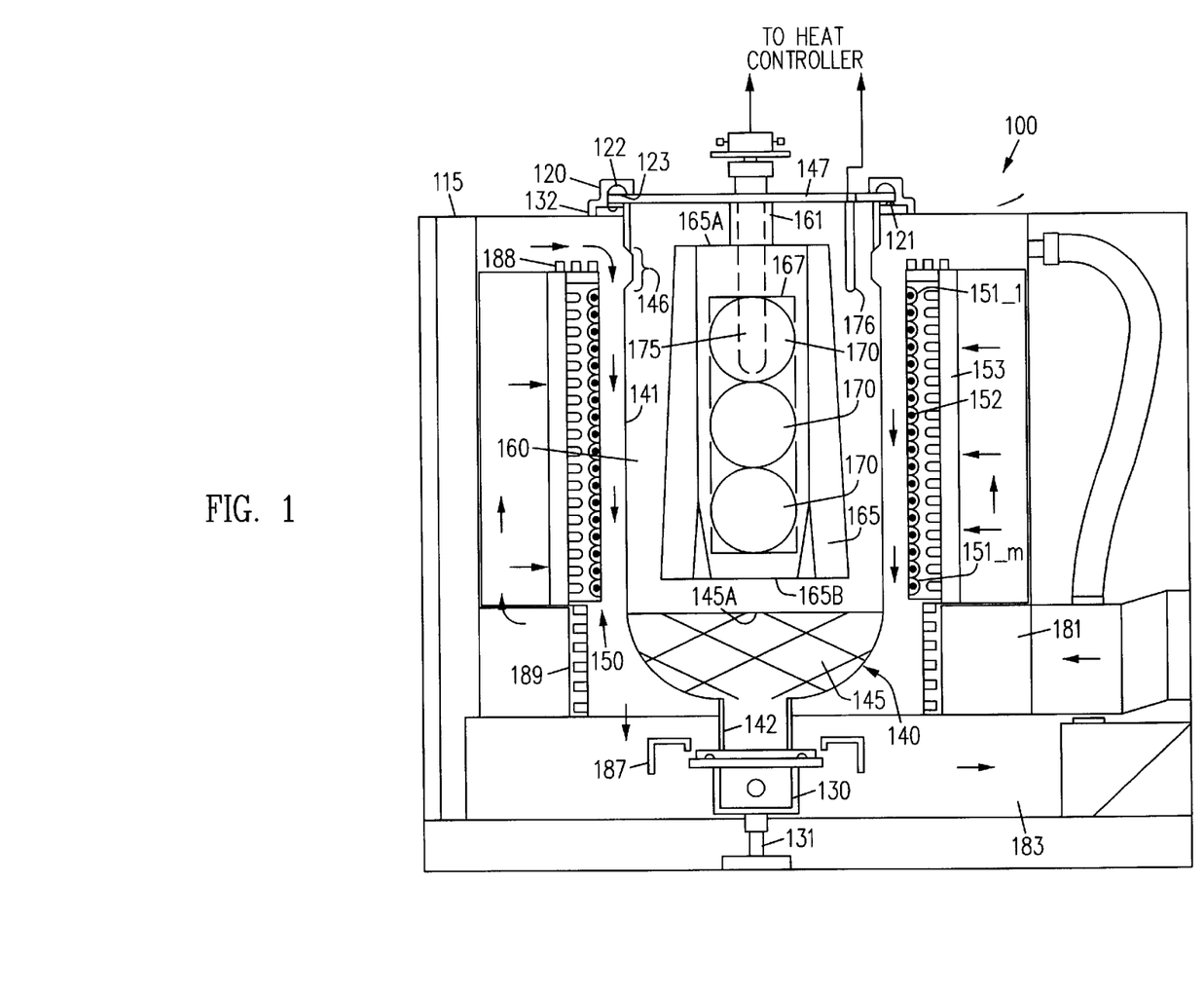
FIG. 1 is a side view of a RTP barrel reactor according to the principles of this invention.

A side cross-sectional view of one embodiment of RTP barrel reactor 100 of this invention is shown in FIG. 1A. A reaction chamber 160 of reactor 100 is defined as the interior volume of a quartz bell jar 140 between a transition region 146 and an edge 145A of a bead-blasted region 145 of bell jar 140. Hence, bell jar 140 is a structure with an interior that defines reaction chamber 160. A transparent vertical sidewall 141 of quartz bell jar 140 extends between transition region 146 and bead-blasted region 145.

A RTP barrel reactor energy stabilizer 165, hereinafter energy stabilizer 165, is suspended in bell jar 140 by a bead-blasted quartz hanger 161, which in turn is rotatably connected through a quartz top flange 147, typically made of white quartz, to a rotation mechanism (not shown) so that energy stabilizer 165 and substrates 170 mounted thereon can be rotated relative to RTP barrel reactor radiant heat source 150. While in FIG. 1, substrates 170 are shown only on a single face of energy stabilizer 165, those of skill in the art will appreciate that each face of energy stabilizer supports three substrates in this embodiment.

As explained more completely below, energy stabilizer 165 is constructed to minimize the thermal mass and consequently to facilitate RTP process cycles. This is in contrast to the prior art CVD barrel reactors that required a susceptor with a larger thermal mass to function as a thermal flywheel. In this embodiment, energy stabilizer 165 is a one piece unit with an open bottom 165B.

The rotation of energy stabilizer 165 ensures uniform heating of energy stabilizer 165 and substrates 170. Rotation speeds are similar to those used in the prior art barrel reactors. However, in tuning RTP barrel reactor 100, the energy stabilizer rotation speed can be varied to assist in achieving a desired performance.

RTP barrel reactor radiant heat source 150, that includes five banks of quartz-halogen lamps 151 in this embodiment, is mounted about the exterior of bell jar 140. The radiant heat energy from RTP barrel reactor radiant heat source 150 is controlled by a dual-mode RTP barrel reactor heat controller 300 (See FIG. 3) so that substrates 170 are heated from an ambient temperature, typically room temperature, to a substantially uniform deposition temperature, typically 1000° C. to 1120° C., in two to five minutes. This heat-up time is considerably shorter than that of prior art conventional CVD barrel reactors that typically required on the order of 15 minutes to go from room temperature to the deposition temperature.

RTP barrel reactor radiant heat source 150 and reactor chamber 160 are contained within a housing 115. Top flange 147 rests on a base plate 132 and is sealed by an O-ring 121 between base plate 132 and top flange 147. Top flange 147 is secured by a gas ring 120 and two O-rings 122, 123. Gas ring 120 is connected to gas sources and a gas controller, that are similar to those used in prior art barrel reactors. The reactant gases are introduced into reaction chamber 160 through gas ring 120. After the gases pass through reaction chamber 160, the gases are exhausted through an opening or openings in a lower flange 142 into a stainless steel exhaust cup 130. Exhaust cup 130 is attached to support assembly 131 which positions bell jar 140 within RTP barrel reactor 100. The gas flow through reaction chamber 160 depends upon the desired film growth rate and the process specifications.

RTP deposition temperatures range up to about 900° to 1200° C., for example, for epitaxial depositions. However, quartz wall 141 is maintained at a cool temperature relative to the deposition temperature, e.g., at about 600° C. for an epitaxial deposition, by forced air cooling. In FIG. 1, the forced air enters plenum 181 and flows through RTP barrel reactor radiant heat source 150 and down side wall 141 to exhaust plenum 183. Forced air is also directed to the top region of bell jar 140 to maintain a positive air flow down side wall 141. Similarly, to protect the other components in reactor 100 from high temperatures, RTP barrel reactor radiant heat source 150 and other components within housing 115 are cooled by a combination of forced air cooling and chillers 153, 188 and 189 that are similar to those used in conventional CVD barrel reactors. The cooling is started at the same time that power is applied to RTP barrel reactor radiant heat source 150.

Components within housing 115, that are subjected to radiant heat, are gold plated to reflect the radiant heat energy back into reaction chamber 160. This limits both heating losses from reaction chamber 160 and heating of components exterior to reaction chamber 160. Also, reflector 187 is provided at the bottom of bell jar 140. The construction and interrelationships of the various components in FIG. 1 are similar to those in the prior art CVD reactors with the exceptions noted.

Also included in RTP barrel reactor 100, in this embodiment, are two temperature sensors. A first temperature sensor 175 is a thermocouple that is lowered in a quartz sheath through quartz hanger 161 into the interior of energy stabilizer 165 and is positioned within energy stabilizer 165 to provide a temperature of energy stabilizer 165. Temperature sensor 175 is not a black body sensor as was used in prior art conventional CVD barrel reactors. The precise location of temperature sensor 175 is determined empirically during tuning of RTP barrel reactor 100. However, typically temperature sensor 175 is located between top 165A of energy stabilizer 165 and the vertical middle of energy stabilizer 165.

The output signal from temperature sensor 175 is one input signal to dual-mode barrel RTP heat controller 300 that is used to control the power to RTP barrel reactor radiant heat source 150. The output signal from temperature sensor 175 is used in defining a control temperature that in turn is used in determining the power to RTP barrel reactor radiant heat source 150, as explained more completely below.

A second temperature sensor 176 is another thermocouple positioned within a quartz sheath, in one embodiment, in the top region of reaction chamber 160. Thermocouple 176 may be positioned at any desired height in reaction chamber 160 and is positioned approximately just below the reflector for the top most lamp in one of the lamp banks. As explained more completely below, the output signal from second temperature sensor 176 is the primary input signal used in generating the control temperature that is used to control the power to RTP barrel reactor radiant heat source 150.

While in this embodiment, a quartz sheath is used for thermocouples 175 and 176, the material used for the sheath is not critical so long as the material is inert with respect to the process or processes being performed in reaction chamber 160 and does not contaminate the substrates. For example, the sheath could be either silicon carbide or stainless steel. Alternatively, both thermocouples 175 and 176 can include thermocouple wire sheathed in quartz with the tip of the thermocouple wire left exposed. The thermocouple wire may be, for instance, type K thermocouple wire. The thermocouple wire is sheathed in quartz to impart stiffness so that the position of the thermocouple wire may more easily be controlled, and to slow the degradation of the thermocouple wire that results from exposure to the gasses present in reaction chamber 160. The tip of the thermocouple wire may be capped with graphite to further protect the thermocouple wire from these gasses. The graphite is sufficiently thermally conductive so that the temperature measurement capability of the thermocouple wire is not substantially inhibited.

In another embodiment of RTP barrel reactor 100, two temperature sensors 175 and 176 are used in combination with an independent measurement of the substrate temperature. The independent measurement of the substrate temperature is used to adjust the control temperature generated using the temperatures from first and second thermocouples 175 and 176. One configuration for providing the independent substrate temperature measurement is described in copending and commonly assigned U.S. patent application Ser. No. 08/703,230, entitled "A METHOD OF MEASURING SUBSTRATE TEMPERATURE IN RADIANT HEATED REACTORS" of William J. Curran and Gary M. Moore filed on Aug. 26, 1996, which is incorporated herein by reference.

Figure 3:
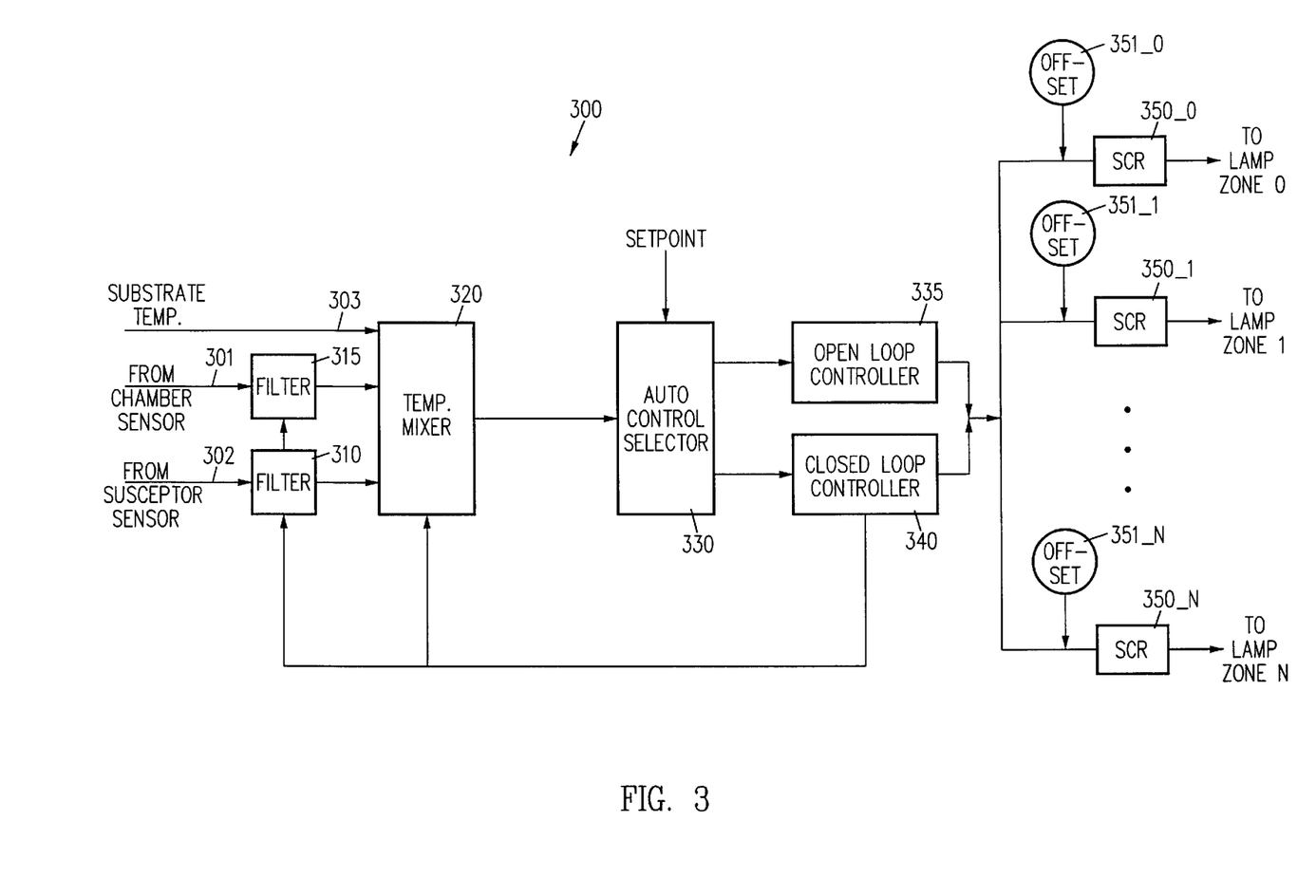
FIG. 3 is a block diagram of the RTP barrel reactor heat controller of this invention.

In this embodiment, while the substrate temperature is less than the deposition temperature minus a predefined offset, dual-mode RTP barrel reactor heat controller 300 operates in an open-loop mode. In the open-loop mode, an open-loop controller 335 can make any desired change in power over any desired time interval. When the substrate temperature reaches the deposition temperature minus a predefined offset, control of RTP barrel reactor radiant heat source 150 switches to a closed-loop mode in which a closed-loop controller maintains the operating temperature approximately constant during the deposition.

A one-piece RTP barrel reactor energy stabilizer 165 has the same general shape as the susceptor used in a conventional CVD barrel reactor for a given substrate diameter, e.g., triangle, pentagon, hexagon, and octagon shapes. However, unlike the susceptors for conventional CVD barrel reactors that were typically one piece and closed at the top and bottom, RTP barrel reactor energy stabilizer 165 is preferably is open at the bottom. Gas flow is maintained through the interior of RTP barrel reactor energy stabilizer 165 so that the gas flow down the faces of RTP barrel reactor energy stabilizer 165 is not affected by the open bottom.

One-piece RTP barrel reactor energy stabilizer 165 is thin-wall silicon-carbide coated graphite, or alternatively all silicon carbide, with pockets for substrates 170 supported thereon and an open bottom 165B. The wall thickness varies from 0.1 inches at the center of a pocket to 0.22 inches at an edge. In the prior art, CVD barrel reactors, the susceptors typically had a wall thickness of at least 0.3 to 0.4 inches. Thus, the prior art susceptors functioned as thermal flywheels, while energy stabilizer 165 is used to minimize heat losses from substrates 170 and so stabilize the heating of substrates 170. Energy stabilizer 165, as well as the other energy stabilizers described below, is a low thermal mass energy stabilizer.

Figure 2A:
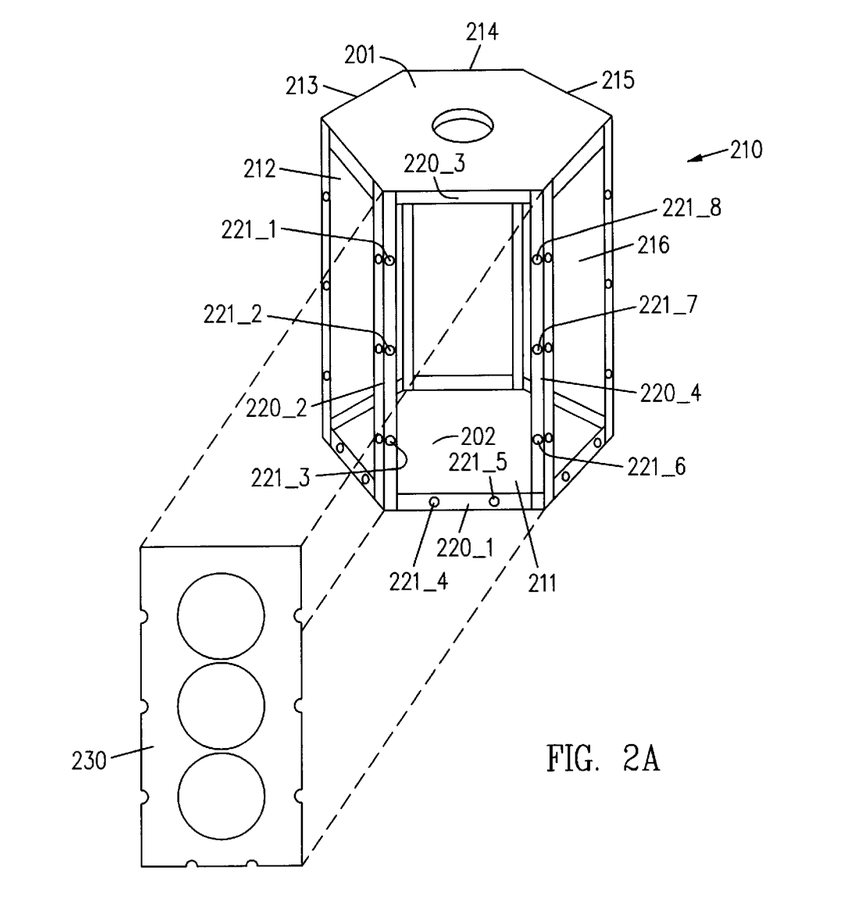
FIG. 2A is an illustration of one embodiment of a RTP barrel energy stabilizer according to the principles of this invention.

FIG. 2A is an illustration of another embodiment of RTP barrel reactor energy stabilizer 165. RTP barrel reactor energy stabilizer 165 includes a support frame 210 that has a plurality of faces, e.g, six faces 211 to 216. Note that faces 211 to 216 of support frame 210 are open and are used only to provide a reference direction for viewing support frame 210. Top 201 of frame 210 is fixedly attached to the support members of frame 210 that contract top 201.

Frame 210 includes a plurality of support members, e.g., vertical members 220_2 and 220_4 and horizontal members 220_1 and 220_3, that support a energy stabilizer face slab 230. In this embodiment, each face of frame 210 supports an identical face slab. A plurality of support pins 221_1 to 221_8 protrude from the support members for face 211 and are used to maintain energy stabilizer face slab 230 on frame 210. Other techniques can be utilized to hold the face slabs on the frame, and the particular technique utilized is not an essential aspect of this invention.

Vertical members 220_2 and 220_4 slope outward, i.e., towards the reaction chamber wall, from top 201 to bottom 202 by about 1°30' to about 2°50' so that the cross-sectional width of bottom 202 is larger than the cross-sectional width of top 201. For example, the six-sided energy stabilizer for 125 mm diameter substrates has a slope, a face angle, of about 2°32'20".

In one embodiment, support members of frame 210 are constructed of silicon carbide coated graphite rods, or alternatively, silicon carbide rods. In another embodiment, support members of frame 210 are made of clear quartz.

In the embodiment of FIG. 2A, energy stabilizer face slab 230 is a thin silicon carbide slab, e.g., the slab has a thickness in the range of about 0.10 inches to about 0.20 inches with three recesses to support substrates. In another embodiment, energy stabilizer face slab 230 is quartz with three recesses in which are inserted substrate surround rings, similar to those disclosed in U.S. patent application Ser. No. 08/185,691 entitled "A RAPID THERMAL PROCESSING APPARATUS FOR PROCESSING SEMICONDUCTOR WAFERS," of Gary M. Moore and Katsuhito Nishikawa filed on Jan. 21, 1994, now U.S. Pat. No. 5,683,518, and U.S. patent application Ser. No. 08/007,981 entitled "A RAPID THERMAL PROCESSING APPARATUS FOR PROCESSING SEMICONDUCTOR WAFERS," of Gary M. Moore and Katsuhito Nishikawa filed on Jan. 21, 1993, now U.S. Pat. No. 5,444,217, both of which are assigned to the assignee of this application, and are incorporated herein by reference. The surface of the quartz face slab containing pockets is bead-blasted in one embodiment.

Figure 2B:
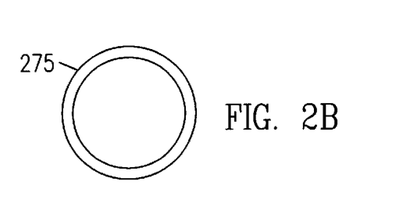
FIGS. 2B and 2C are a top view and a side view, respectively, of one embodiment of a substrate surround ring suitable for use with one embodiment of the RTP barrel energy stabilizer of this invention.
Figure 2C:
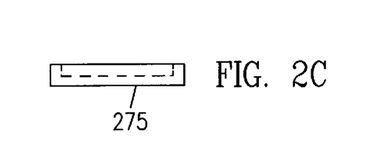

Herein, in a first embodiment, substrate round 275 (FIGS. 2B and 2C) is a single piece that is placed into a recess, sometimes referred to as a "pocket," in the quartz energy stabilizer face slab. The diameter of the recess is chosen so that substrate surround ring 275 can fit into the recess. Substrate surround ring 275 in turn has a recess in which the substrate is supported. The depth of the recess in the energy stabilizer face slab is chosen in one embodiment so that the top surface of a substrate is approximately level with the surface of the energy stabilizer when substrate surround ring is placed in the pocket and the substrate in turn is placed on the substrate surround ring.

Figure 2D:
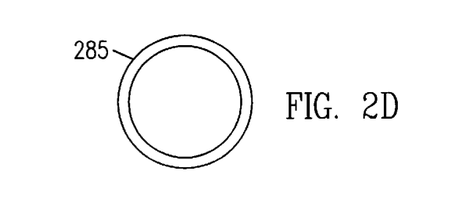
FIGS. 2D and 2E are a top view and a side view, respectively, of another embodiment of a substrate surround ring suitable for use with one embodiment of the RTP barrel energy stabilizer of this invention.
Figure 2E:
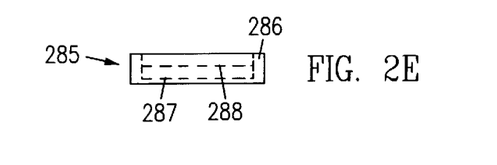

In another embodiment, substrate surround ring 285 is multiple pieces. An outer ring 286 (FIGS. 2D and 2E) is placed in the recess in the energy stabilizer. Next an energy stabilizer insert 287, which in this embodiment is cloth of carbon or silicon carbide, or silicon carbide, is placed inside outer ring 286. Finally, a spindle 288 is placed inside outer ring 286 and on top of energy stabilizer insert 287. Alternatively energy stabilizer insert 287 could be a reflective material. In another embodiment, insert 287 is placed in the recess, and spindle 288 is then inserted. This defines a recess in which is placed outer ring 286.

In still another embodiment, each energy stabilizer face slab is a quartz slab that supports three substrate surround rings, for example, and a plurality of heat distribution elements. This configuration is similar to that disclosed in commonly assigned U.S. patent application Ser. No. 08/453, 419 entitled "A MULTI-LAYER SUSCEPTOR FOR RAPID THERMAL PROCESS REACTORS" of Gary M. Moore filed on May 30, 1995, and which issued as U.S. Pat. No. 5,580,388 on Dec. 3, 1996 and which is incorporated herein by reference in its entirety. In particular, the description of the configuration of the multi-layer susceptor with the heat distribution elements and the associated figures are incorporated herein by reference. While the susceptor is horizontal in the patent, and the surround ring is shaped like a C with an insert, in this embodiment, the surround rings are similar to those in FIG. 2B, and the plurality of heat distribution elements are thin silicon carbide, or graphite coated with silicon carbide that are mounted on the quartz face slab about the surround rings. The quartz face slab includes quartz pins that are used to maintain the energy distribution elements in place on the quartz face slab. Again, a surface, surfaces, or selected regions of the quartz face slab can be bead-blasted so that a uniform temperature is obtained in substrates 170.

Each bank of lamps of RTP barrel reactor radiant heat source 150 includes a plurality of lamps, e.g, 14 to 20 lamps. Each lamp is a quartz-halogen lamp with a tungsten filament that produces radiant energy in a short wavelength range, i.e., approximately one micron or below. One source of lamps suitable for use in this invention is sold under Model No. QIR 480-6000E by Ushio American, Inc. of Torrance, Calif. 90502. The specification for these lamps is shown in Table 2.

TABLE 2

Specification for Radiant Energy Lamps

| Design Volts Diameter (v) | Design Watts (W) | Color Temp. (° K.) | Maximum Overall Length (mm) | Maximum Light Length (mm) | Bulb (mm) |
| --- | --- | --- | --- | --- | --- |
| 480 | 6,000 | 3,150 | 300 | 248 | 11 |

Each lamp 151_i, where i ranges from 1 to m, is mounted in a 1.125 inch (2.858 cm) parabolic gold-plated, highly-polished reflector 152. The reflectors are provided to maximize the amount of heat transmitted to reaction chamber 160, and thus to the substrates therein. Radiant energy that is emitted from the lamps in a direction away from reaction chamber 160 is redirected by the reflectors toward reaction chamber 160. Additionally, any energy radiated from reaction chamber 160 redirected by the reflectors toward reaction chamber 160. Generally, the reflectors can have any shape and orientation that does not result in limiting the life of the lamps, or that does not result in an uneven temperature distribution in a substrate. Reflectors suitable for use in this invention are available from Hammond Plating, 890 Commercial Street, Palo Alto, Calif. 94303.

As illustrated in FIG. 1, each bank of lamps in RTP barrel reactor radiant heat source 150 forms a column that is separated from an exterior surface of wall 141 of reaction chamber 160. The vertical length of the each bank of lamps is about 25% greater than the length of flat zone 167.

As is known to those of skill in the art, the radiant energy from each lamp is directly proportional to the voltage and current across the lamp. To precisely control the input radiant energy to assure a uniform temperature across a substrate during deposition, each bank of RTP barrel reactor radiant heat source 150 is divided into six to ten zones and in one embodiment is divided into eight zones. The actual number of zones is selected empirically based upon the size of substrate area 167 on energy stabilizer 165, and the total number of lamps radiating energy that covers that area.

Irrespective of the total number of heat zones selected per lamp bank, zones near the top or bottom of RTP barrel reactor energy stabilizer 165 have fewer lamps, while zones near the vertical middle of energy stabilizer 165 have more lamps. This allows tailoring the radiant energy heat distribution at the top and bottom of reaction chamber 160 to compensate for the greater heat losses in those areas. The heat zones are selected to provide a resolution so that a uniform temperature is achieved across each substrate on energy stabilizer 165, which in one embodiment is about a two inch resolution on heat control.

As is known, the vertical radiant heat energy distribution during deposition can be either symmetric or unsymmetric depending on the conditions within reaction chamber 160. The particular distribution is selected during tuning of RTP barrel reactor 100 to obtain the desired quality of the deposited film.

The radiant heat energy delivered by RTP barrel reactor radiant heat source 150 is determined by dual-mode RTP barrel reactor heat controller 300 (FIG. 3), which in one embodiment is processes that execute on a process computer of RTP barrel reactor 100. Dual-mode RTP barrel reactor heat controller 300 receives at least two input signals. A first input signal 301 is provided by a first temperature sensor 176, e.g., a first thermocouple, that is mounted in reaction chamber 160 as described above. A second input signal 302 is provided by a second temperature sensor 175, e.g., a second thermocouple, that is mounted in the interior of RTP barrel reactor energy stabilizer 165. An optional third input signal 303 is provided by a system that measures the substrate temperature directly such as the system described in copending and commonly assigned U.S. patent application Ser. No. 08/703,230, entitled "A METHOD OF MEASURING SUBSTRATE TEMPERATURE IN RADIANT HEATED REACTORS" of William J. Curran and Gary M. Moore filed on Aug. 26, 1996, which is incorporated herein by reference.

First input signal 301 drives a filter unit 315 and second input signal 302 drives a filter unit 310. In this embodiment, filter units 310 and 315 both include a pass through circuit and a logarithmic filter circuit. The output signals from filter units 310 and 315 are first and second input signals to temperature mixer 320. The optional substrate temperature signal 303 is a third input signal to temperature mixer 320.

Temperature mixer 320 combines the two temperature measurements, i.e., first and second input signals 301 and 302, into a control temperature that is provided to the reactor operator, and to automatic control selector 330. The control temperature is a measure of the substrate temperature. Thus, the two input temperatures are combined to generate a control temperature that approximates the substrate temperature. Typically, during deposition, the contribution to the control temperature from temperature sensor 175 is at a maximum and is about thirty-five percent. Control temperature is calibrated during test runs of reactor 100 by correlating thermocouple measurements to temperature measurements of test wafers taken by another thermocouple that contacts the test wafers for example. Alternatively, the temperature measurements of test substrates can be made using the method described in copending and commonly assigned U.S. patent application Ser. No. 08/703,230, entitled "A METHOD OF MEASURING SUBSTRATE TEMPERATURE IN RADIANT HEATED REACTORS" of William J. Curran and Gary M. Moore filed on Aug. 26, 1996, which is incorporated herein by reference.

Initially, the temperatures from temperature sensors 175 and 176 are not particularly accurate and so automatic control selector 300 comes up in the open-loop control mode which enables open-loop controller 335. This is done independent of the initial values of the control temperature. The operation of open-loop controller 335 does not depend upon the affect of its output signal on the temperature of substrates 170 in reaction chamber 160 to determine how to control the output current and voltage applied to silicon controlled rectifiers (SCR) 350_0 to 350_N for zones 0 to N respectively of each lamp bank. Rather, open-loop controller 335 simply ramps-up the power to RTP barrel reactor radiant heat source 150 using an empirical table that is power level vs. time. Open-loop controller 335 does not impose any limitations on how the power to RTP barrel reactor radiant heat source 150 is ramped up. The time segments used can be of any desired length, and the power change over a time segment, as well as from time segment to time segment can be any desired magnitude.

Open-loop controller 335 allows establishment of a number of different power ramp rates during initial heating of the substrates. In one embodiment of the invention, up to thirty different ramp rates can be used during initial heating by appropriately preprogramming the computer used to implement open-loop controller 335. The power ramp rates used are determined empirically through a series of test runs of reactor 100, and are selected so as to maintain a substantially uniform temperature in each of the substrates and between substrates, and if appropriate to the process, to minimize dislocations within the substrates.

Figure 4:
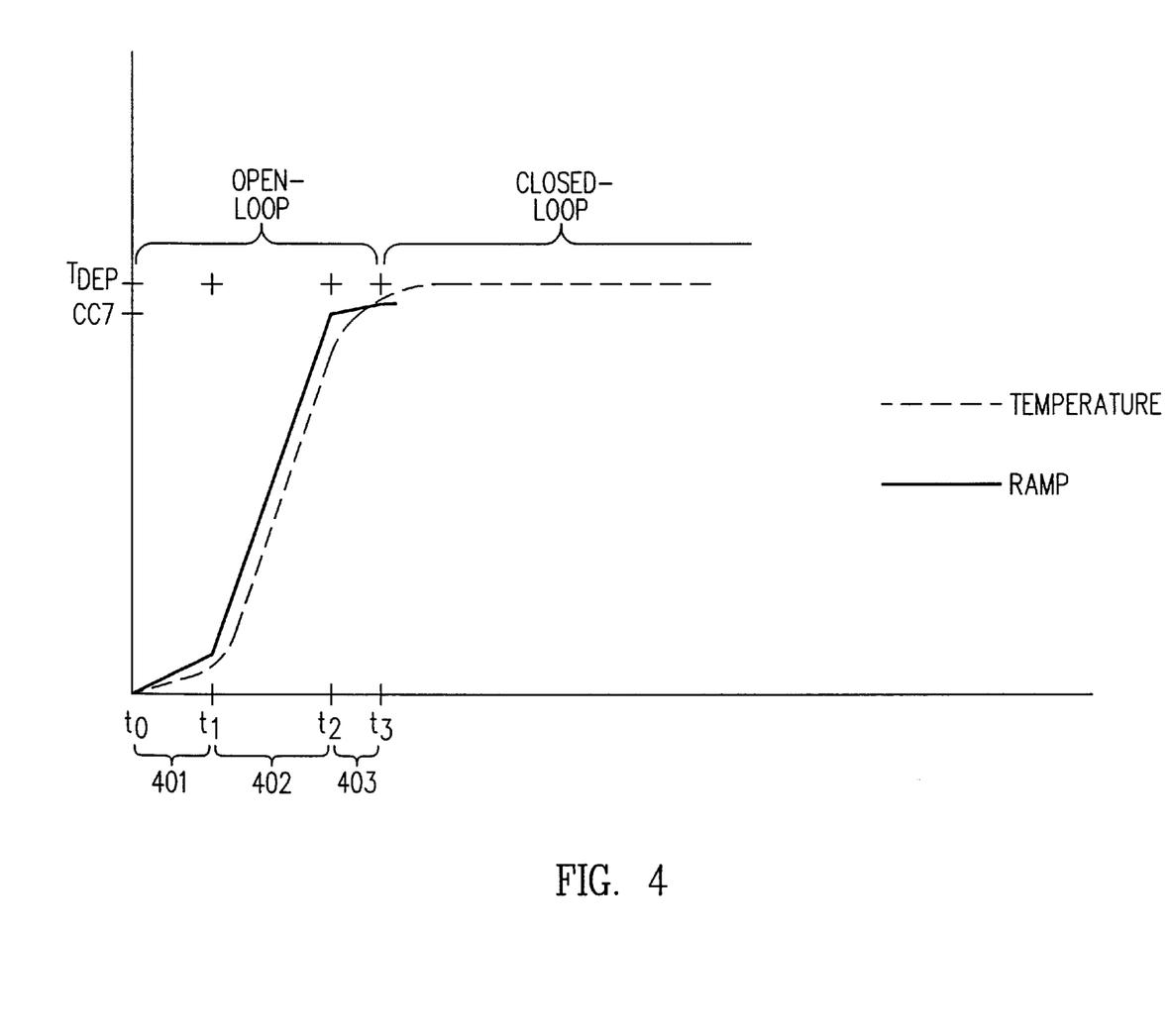
FIG. 4 is a diagram of a input to the open-loop controller utilized during heat-up of the RTP barrel reactor of this invention.

For example, FIG. 4 illustrates a three segment open-loop heat-up that is implemented by open-loop controller 335. Over first time segment 401, the power is increased gradually from time t0 to time t1 to reduce thermal shock to substrates 170. Over second time segment 402, the power is increased rapidly from time t1 to time t2 to bring barrel RTP reactor 100 close to the operating temperature while raising the temperature uniformly across each substrate. Over third time segment 403, the power is adjusted to allow barrel RTP reactor 100 to stabilize at the operating temperature as automatic control selector 330 switches the mode of operation, as described more completely below.

Hence, open-loop controller 335 automatically controls each zone of lamps according to parametric information stored in the computer that is based upon previous temperature calibrations performed with reactor 100. The parametric information obtained from the calibration runs is used to change the SCR currents to achieve the proper spatial and temporal heat distributions necessary to maintain substantially uniform temperature throughout substrates 170 during the initial heat-up of reactor 100.

A plurality of silicon controlled rectifiers (SCRs) controls the current supplied to RTP barrel reactor radiant heat source 150 and, thus, the amount of radiant heat generated by RTP barrel reactor radiant heat source 150. Each of SCRs 350_0 to 350_N controls a group of lamps, i.e., a zone, by controlling the current to the lamps in the corresponding zone. The power to all lamps is either increased or decreased as one, since each SCR is supplied the same signal from dual mode RTP barrel reactor heat controller 300. However, the ratio of power between lamps is fixed, so that an increase in power from RTP barrel reactor heat controller 300 results in different amounts of increase to individual zones according to the pre-determined (during the calibration runs) power ratios for the various zones.

As the temperature of the substrates increases and reaches a level at which temperature sensors 175 and 176 operate accurately, e.g., 800 to 1100° C. if thermocouples are used as the temperature sensors, automatic control selector 300 compares the control temperature with a controller change temperature, that is defined below.

Also, after the output signals of temperature sensors 175 and 176 indicate that the measured temperatures are within a temperature range that temperature sensors 175 and 176 operate accurately, if the optional temperature measurement is available, the control temperature is compared with the actual measured substrate temperature by temperature mixer 320. If the two temperatures are different, temperature mixer 320 adjusts the control temperature to make the two temperatures the same.

As explained in copending U.S. patent application Ser. No. 08/703,230, entitled "A METHOD OF MEASURING SUBSTRATE TEMPERATURE IN RADIANT HEATED REACTORS" of William J. Curran and Gary M. Moore filed on Aug. 26, 1996, the optional temperature measurement is made only at selected intervals and requires briefly terminating power to RTP barrel reactor radiant heat source 150. Thus, the control temperature is checked by temperature mixer 320 only at the selected intervals. This feature assures uniform processing conditions from batch to batch by compensating for any deterioration of temperature sensors 175 and 176 which causes generation of different temperatures for similar conditions in different batches.

The control temperature signal from temperature mixer 320 is applied to automatic control selector 330. A setpoint temperature, typically the operating temperature for the process being performed is also an input signal to automatic control selector 330. The control temperature is known to lag the actual substrate temperature. Consequently, a predefined temperature offset corresponding to the temperature lag is programmed into automatic control selector 330 during tuning of RTP barrel reactor 100. Typically, the predefined temperature offset is in the range of about 20° C. to 100° C.

Hence, the predefined temperature offset is subtracted from the setpoint temperature to obtain a controller change temperature, i.e., $$CCT = Tset - Toff$$

where
CCT is the controller change temperature;
Tset is the setpoint temperature; and
Toff is the predefined temperature offset.

In this embodiment, the comparator in automatic control selector 330 compares the control temperature with controller change temperature CCT. When controller change temperature CCT is less than or equal to the control temperature, automatic control selector 330 enables closed-loop controller 340, and disables open-loop controller 335, e.g., quits using controller 335. After closed-loop controller 340 is enabled, the comparator function in no longer used and the control temperature is passed through automatic control selector 330 to closed-loop controller 340.

The control temperature is monitored by and used by closed-loop controller 340 along with stored parametric information about reactor 100 to make appropriate adjustments to signals controlling SCRs 350_0 to 350_N so as to maintain the temperature distribution throughout substrates 170 within predetermined limits during deposition. In this embodiment, closed-loop controller 340 uses a proportional integral differential (PID) controller to maintain the operating deposition temperature with about a ±5° C. range.

Further, to limit any oscillatory behavior of the PID controller within closed-loop controller 340, closed-loop controller 340 enables the logarithmic filter circuits in filter units 310 and 315, prior to this time the pass-through path was used. Also, during testing and tuning of reactor 100, it may be observed that while the PID controller is working properly, the deposition temperature, sometimes referred as the operating temperature, drifts in a predictable and reproducible manner during the deposition process. For example, the deposition temperature could drop a few degrees over the deposition process, or alternatively the deposition temperature could rise a few degrees over the deposition process.

In either case, a ramp compensating for the temperature drift over the deposition process is incorporated in temperature mixer 320, e.g., is preprogrammed in temperature controller 300. In this embodiment, the temperature ramp is used within temperature mixer 320 to generate a control temperature that maintains the operating temperature within the desired temperature band when closed-loop controller 340 is active, i.e., used. This change is made after the control temperature is corrected by the optional temperature measurement. The ability to input a ramp in combination with the closed-loop control eliminates any observed drift in the operating temperature.

Finally, each zone includes an offset control 351_i where i ranges from 0 to N. In tuning reactor 100, typically the resistivity throughout the deposited film is measured. If the resistivity is not within acceptable margins, the offset controls provide a fine resistivity adjustment capability to bring the resistivity throughout the deposited film to the desired level of uniformity.

In the above description, two alternative energy stabilizers were described. These examples are illustrative only and are not intended to limit the invention to these particular embodiments. Other suitable embodiments are described below.

Generally, the energy stabilizers of this invention can be grouped into three types: (i) a one piece thin wall energy stabilizer; (2) an energy stabilizer with a plurality of thin face slabs; (3) an energy stabilizer with each face slab having a multiplicity of pieces. In the following disclosure, specific embodiments of the energy stabilizers of this invention are described for six inch substrates. This disclosure is illustrative of the principles of this invention and is not intended to limit the invention to energy stabilizers for six inch substrates. In view of this disclosure, those of skill in the art can made an energy stabilizer for any of the substrate diameters described above.

Figure 5A:
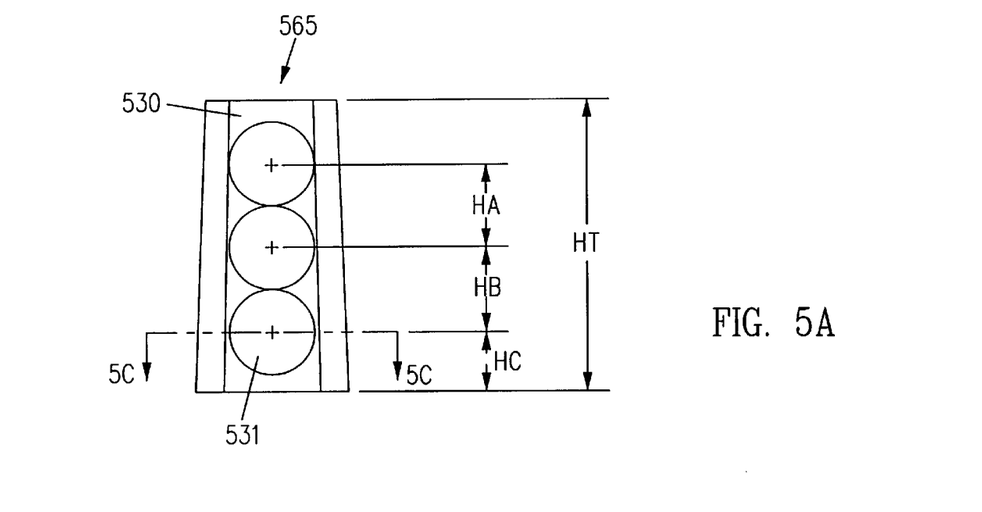
FIGS. 5A to 5C are a side view, a cut-away view, and a cross-sectional view respectively of one embodiment of a single piece RTP barrel reactor energy stabilizer with an open bottom.

FIG. 5A is a side view of a one-piece thin wall energy stabilizer 565, that is similar to that shown in FIG. 1, and that has an open bottom. Energy stabilizer 565 has five identical faces and each face supports three six inch substrates. In FIG. 5A, only the details of face 530 are illustrated for convenience. The dimensions illustrated in FIG. 5A are the lengths measured parallel to face 530. One embodiment of these dimensions is given in Table 2.

TABLE 2

| Face Dimensions for Energy stabilizer 565 | |
|---|---|
| Reference No. | Length (inches) |
| HA | 6.000 Typical |
| HB | 6.000 Typical |

TABLE 2-continued

| Face Dimensions for Energy stabilizer 565 | |
|---|---|
| Reference No. | Length (inches) |
| HC | 4.250 Typical |
| HT | 20.841 Typical |

When energy stabilizer 565 is made of silicon carbide coated graphite, the dimensions discussed herein are the dimensions after the silicon carbide coating. In one embodiment, the silicon carbide coating has a thickness of in the range of 0.004 inches to 0.010 inches and in one embodiments is 0.004 inches. In addition, all sharp edges and corners of energy stabilizer 565 are formed to have a radius of at least 0.03 inches.

Figure 5B:
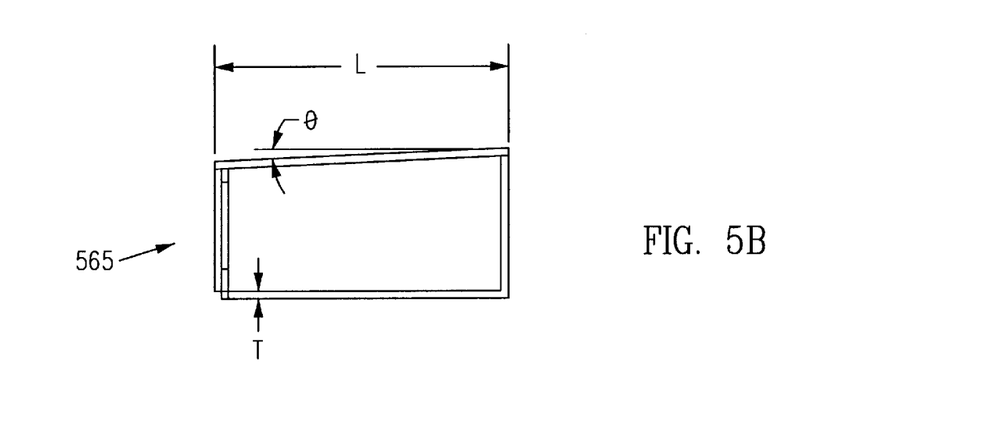

FIG. 5B is a cut-away view of energy stabilizer 565 that illustrates face angle θ of face 530, overall length L, and wall thickness T of energy stabilizer 565. In this embodiment, face angle θ is 2°; length L is 20.825 inches; and wall thickness T is 0.100 inches.

Figure 5C:
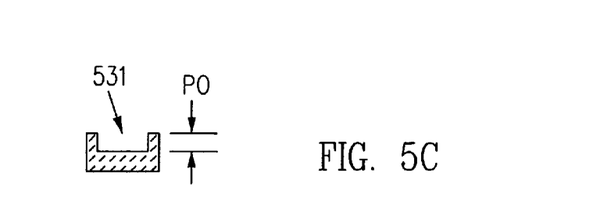

FIG. 5C is a cross-sectional view through pocket 531 and is typical of each pocket of energy stabilizer 565. In this embodiment, pocket 531 has a pocket depth PD, which is 0.05 inches.

Figure 6A:
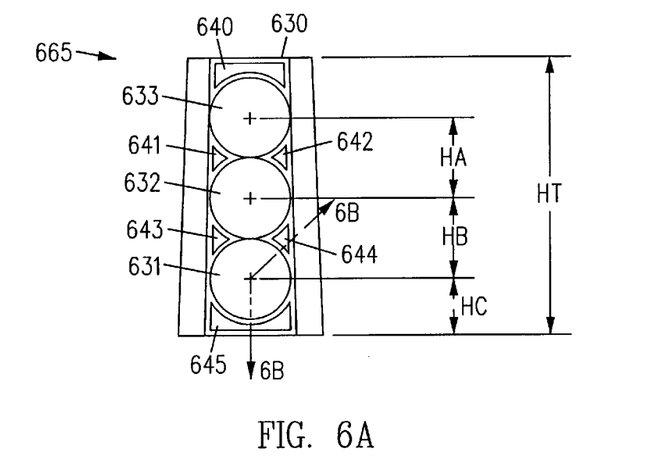
FIGS. 6A and 6B are a side view and a cross-sectional view respectively of another embodiment of a single piece RTP barrel reactor energy stabilizer with an open bottom.

FIG. 6A is a side view of another embodiment of a one-piece thin wall energy stabilizer 665 that has an open bottom. Energy stabilizer 665 has five identical faces and each face supports three six inch substrates. In FIG. 6A, only the details of face 630 are illustrated for convenience. The face dimensions of energy stabilizer 665 are the same as those given in Table 2. Similarly, the other dimensions of energy stabilizer 665 are similar to those of energy stabilizer 565. Like energy stabilizers 165, and 565, energy stabilizer 665 has three pockets 631 to 633 formed in face 630 to support the three six inch substrates. However, in addition, to lower the thermal mass of energy stabilizer 665 even more, face 630 has additional pockets 640 to 645 formed about pockets 631 to 633. Additional pockets 640 to 645 are formed to create a substrate surround ring, about each substrate, that is integral to energy stabilizer 665, and are formed to create a frame about the perimeter of face 630. For processes in which pockets 640 to 645 affect the deposition of a film on substrates placed in pockets 631 to 633, quartz inserts are placed in pockets 640 to 645 so that face 630 is substantially planar about pockets 631 to 633.

Figure 6B:
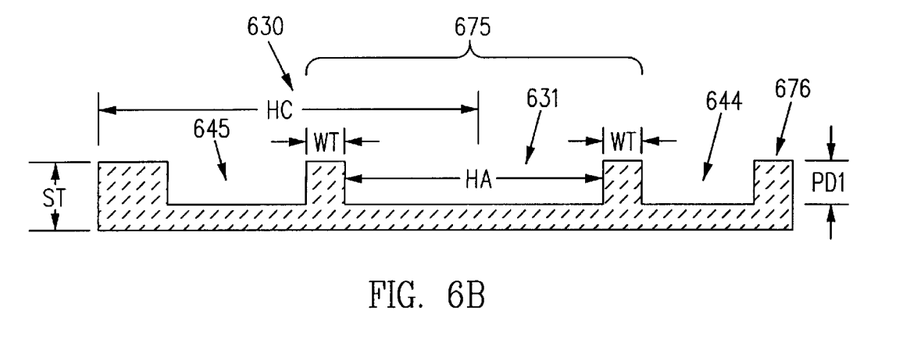

FIG. 6B is a cross-sectional view of the section of energy stabilizer 665 as indicated in FIG. 6A. Energy stabilizer 665 has a back portion with a uniform thickness of 0.100 inches. Substrate surround ring 675, with a rim width WT which in one embodiment is 0.100 inches, is formed above this back portion with a uniform thickness to define pocket 631 that has a depth of PD1 and a diameter of HA. Of course, depth PD1 is the rim height of substrate surround ring 675, and diameter HA is the inner diameter of substrate surround ring 675. The outer diameter of substrate surround ring 675 is (HA+2*WT). In this embodiment depth PD1 is 0.045 inches and so total thickness ST of face 630, as defined by substrate ring 675, is 0.145 inches.

At the bottom of face 630 and along each vertical edge, energy stabilizer also has thickness ST so that a rim is formed about the perimeter of face 630 with height ST. Hence, pocket depth PD1 is 0.045 inches. In this embodiment, rim 676 along the vertical edge of face 630 has a width of 0.100 inches.

Figure 7A:
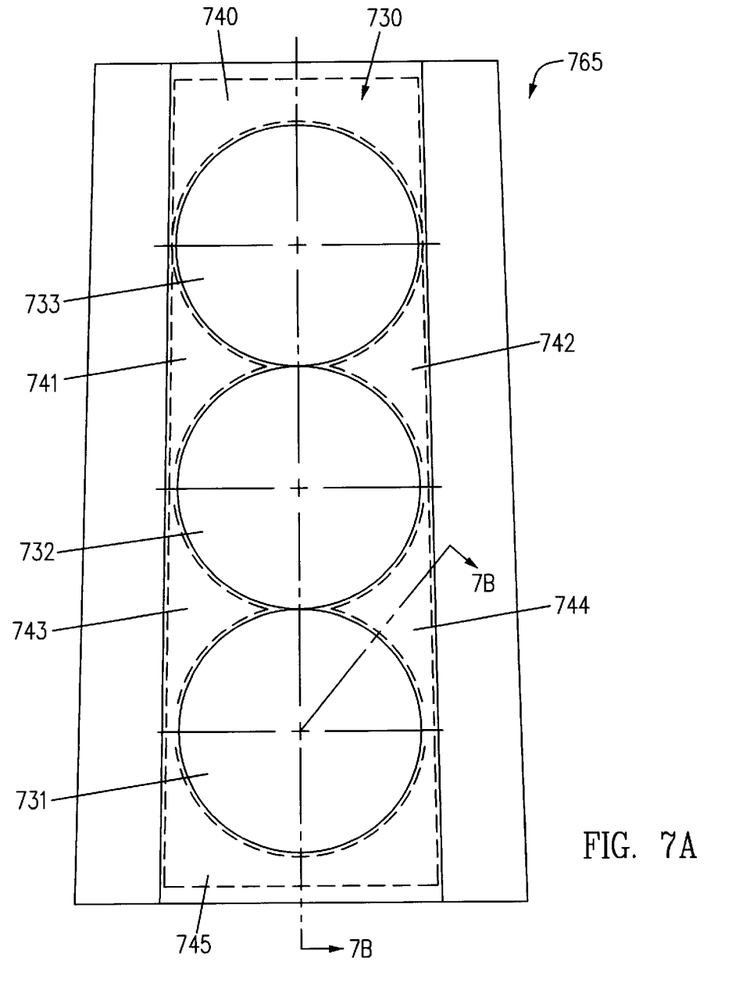
FIGS. 7A and 7B are a side view and a cross-sectional view respectively of yet another embodiment of a single piece RTP barrel reactor energy stabilizer with an open bottom.

FIG. 7A is a side view of another embodiment of a one-piece thin wall energy stabilizer 765 that has an open bottom. Energy stabilizer 765 has five identical faces and each face supports three six inch substrates. In FIG. 7A, only the details of face 730 are illustrated for convenience. The face dimensions of energy stabilizer 765 are the same as those given in Table 2. Similarly, the other dimensions of energy stabilizer 765 are similar to those of energy stabilizer 665.

Like energy stabilizers 165, and 565, energy stabilizer 765 has three pockets 731 to 733 formed in face 730 to support the three six inch substrates. However, in addition, to lower even more the thermal mass of energy stabilizer 765, face 730 has additional pockets 740 to 745 formed about pockets 731 to 733 on the backside of face 730. Additional pockets 740 to 745 are formed to create a substrate surround ring, about each substrate, that is integral to energy stabilizer 765, and are formed to create a frame about the perimeter of face 730. In this embodiment, face 730 is substantially planar about pockets 731 to 733.

Figure 7B:
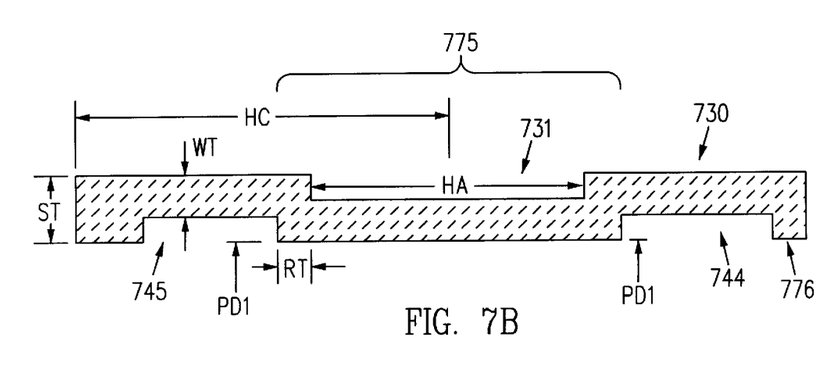

FIG. 7B is a cross-sectional view of the section of energy stabilizer 765 as indicated in FIG. 7A. Substrate surround ring 775 has a rim with a width RT, which in one embodiment is 0.100 inches, and a height ST, which in this embodiment is 0.145 inches. Pocket 731 has a depth of PD1, which is 0.045 inches in this embodiment, and a diameter of HA. Thus, wall thickness WT in this embodiment is 0.100 inches. Of course, depth PD1 is the inner rim height of substrate surround ring 775, and diameter HA is the inner diameter of substrate surround ring 775.

At the bottom of face 730 and along each vertical edge, energy stabilizer 765 also has thickness ST so that a rim is formed about the perimeter of face 730 with height ST. In this embodiment, rim 776 along the vertical edge of face 730 has a width of 0.100 inches.

Thus, in this embodiment, energy stabilizer 765 has a first plurality of pockets 731 to 733 on a face 730 of energy stabilizer 765, and a second plurality of pockets 740 to 745 formed in an inner surface of energy stabilizer 765 that is opposite, parallel to, and removed from face 730. Pockets 740 to 745 are formed such that a substrate surround ring that is integral to energy stabilizer 765 is formed about each of pockets 731 to 733, and such that a rim is formed about the perimeter of face 730 where the rim has a greater thickness than portion of face 730 immediately adjacent to the rim.

Figure 8A:
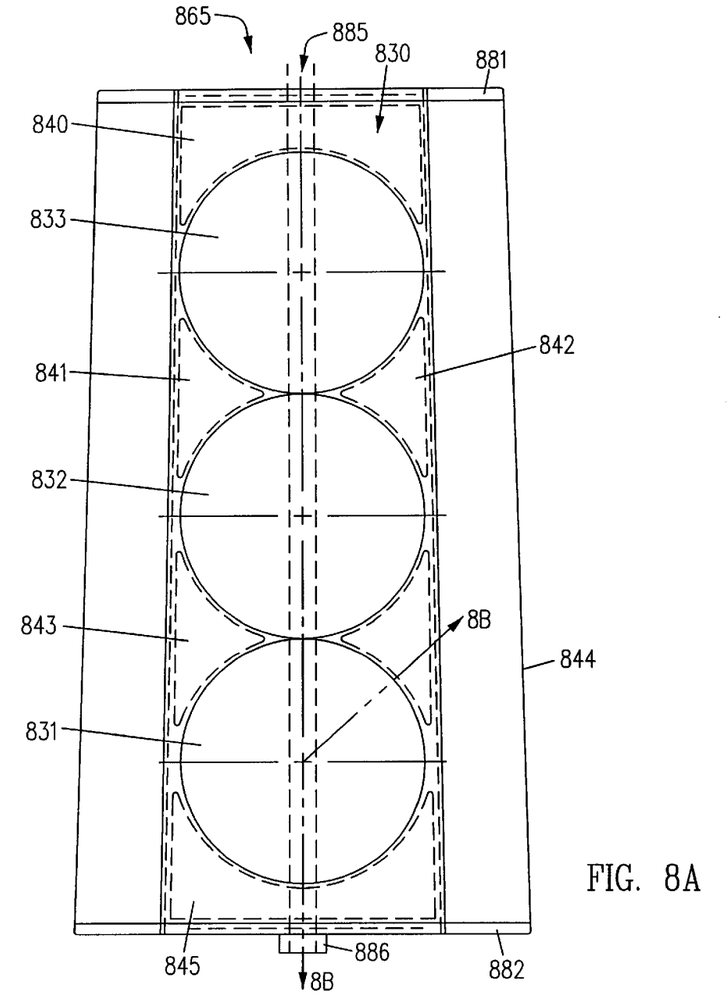
FIGS. 8A and 8B are a side view and a cross-sectional view respectively of one embodiment of a RTP barrel reactor energy stabilizer with a plurality of face slabs.

FIG. 8A is a side view of another embodiment of an energy stabilizer 865 that has a plurality of face slabs that sit in a bottom frame plate 882 and a top frame plate 881. A central shaft 885 extends through top frame plate 881 down through the interior of energy stabilizer 865 though bottom frame plate 882 where shaft 882 mates with an end cap 886. Energy stabilizer 865 has five identical face slabs and each face slab supports three six inch substrates. In FIG. 8A, only the details of face slab 830 are illustrated for convenience. The face slab dimensions and overall dimensions of energy stabilizer 865 are the same as those given in Table 2. Similarly, the other dimensions of energy stabilizer 865 are similar to those of energy stabilizer 665.

Like energy stabilizers 165, and 565, energy stabilizer 865 has three pockets 831 to 833 formed in the outer surface of face slab 830 to support the three six inch substrates. However, in addition, to lower even more the thermal mass of energy stabilizer 865, face slab 830 has additional pockets 840 to 845 formed about pockets 831 to 833 on the backside of face slab 830 in a manner similar to that described above for energy stabilizer 765. Additional pockets 840 to 845 are formed to create a substrate surround ring, about each substrate, that is integral to energy stabilizer 865, and are formed to create a frame about the perimeter of face slab 830. In this embodiment, the outer surface of face slab 830 is substantially planar about pockets 831 to 833.

Figure 8B:
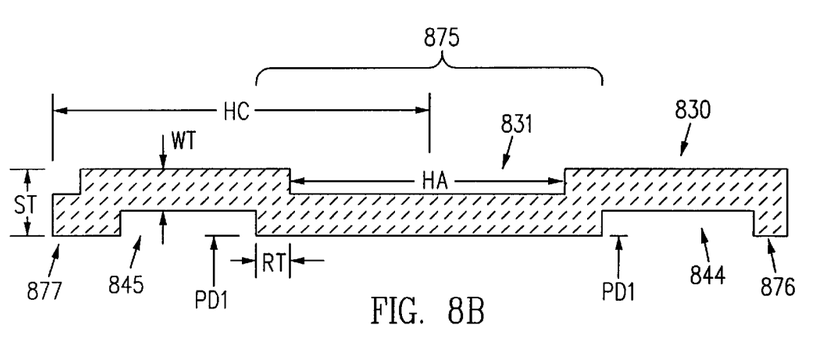

FIG. 8B is a cross-sectional view of the section of face slab 830 of energy stabilizer 865 as indicated in FIG. 8A. Substrate surround ring 875 has a rim width RT, which in one embodiment is 0.100 inches, and a height ST, which in this embodiment is 0.145 inches. Pocket 831 has a depth of PD1, which is 0.045 inches in this embodiment, and a diameter of HA. Thus, wall thickness WT, in this embodiment, is 0.100 inches. Of course, depth PD1 is the inner rim height of substrate surround ring 875, and diameter HA is the inner diameter of substrate surround ring 875.

At the bottom of face slab 830 and along each vertical edge, energy stabilizer also has thickness ST so that a rim is formed about the perimeter of face 830 with height ST. In this embodiment, rim 876 along the vertical edge of face 830 has a width of 0.100 inches. Also, the vertical edges of face slab 830 are beveled to form a closed surface with the two adjacent face slabs. In addition, bottom end 877 of face slab 830 has a lip that fits into a groove in the top surface of bottom frame plate 882. Similarly, the top end of face slab 830 has a lip that fits into a groove in the bottom surface of top frame plate 881. Thus, in this embodiment, energy stabilizer 865 has a first plurality of pockets 831 to 833 on outer surface of a face slab 830 of energy stabilizer 865, and a second plurality of pockets 840 to 845 formed in an inner surface of face slab 830 that is opposite, parallel to, and removed from the outer surface of face slab 830. Pockets 840 to 845 are formed such that a substrate surround ring that is integral to energy stabilizer 865 is formed about each of pockets 831 to 833, and such that a rim is formed about the perimeter of face 830 where the rim has a greater thickness than portion of face 830 immediately adjacent to the rim. In addition, a top end and a bottom end, e.g., first and second opposing ends, of face slab 830 each have a lip for engagement with a top frame plate and a bottom frame plate respectively.

In the previous embodiment, each face slab 830 of energy stabilizer 865 had a configuration similar to a face 730 of the corresponding one piece energy stabilizer 765. Similarly, a face slab could be constructed that had a configuration similar to face 630 of one piece energy stabilizer 665. In this embodiment, each face slab includes on the outer surface the plurality of pockets for the substrates; the plurality of pockets formed about the substrate pockets to form the substrate surround rings and the rim about the perimeter of the face slab; and lips an the top and bottom edges of the face slab. Considering the similarity of the various embodiments, a drawing is unnecessary for understanding the slab configuration that is equivalent to energy stabilizer 665.

Figure 9:
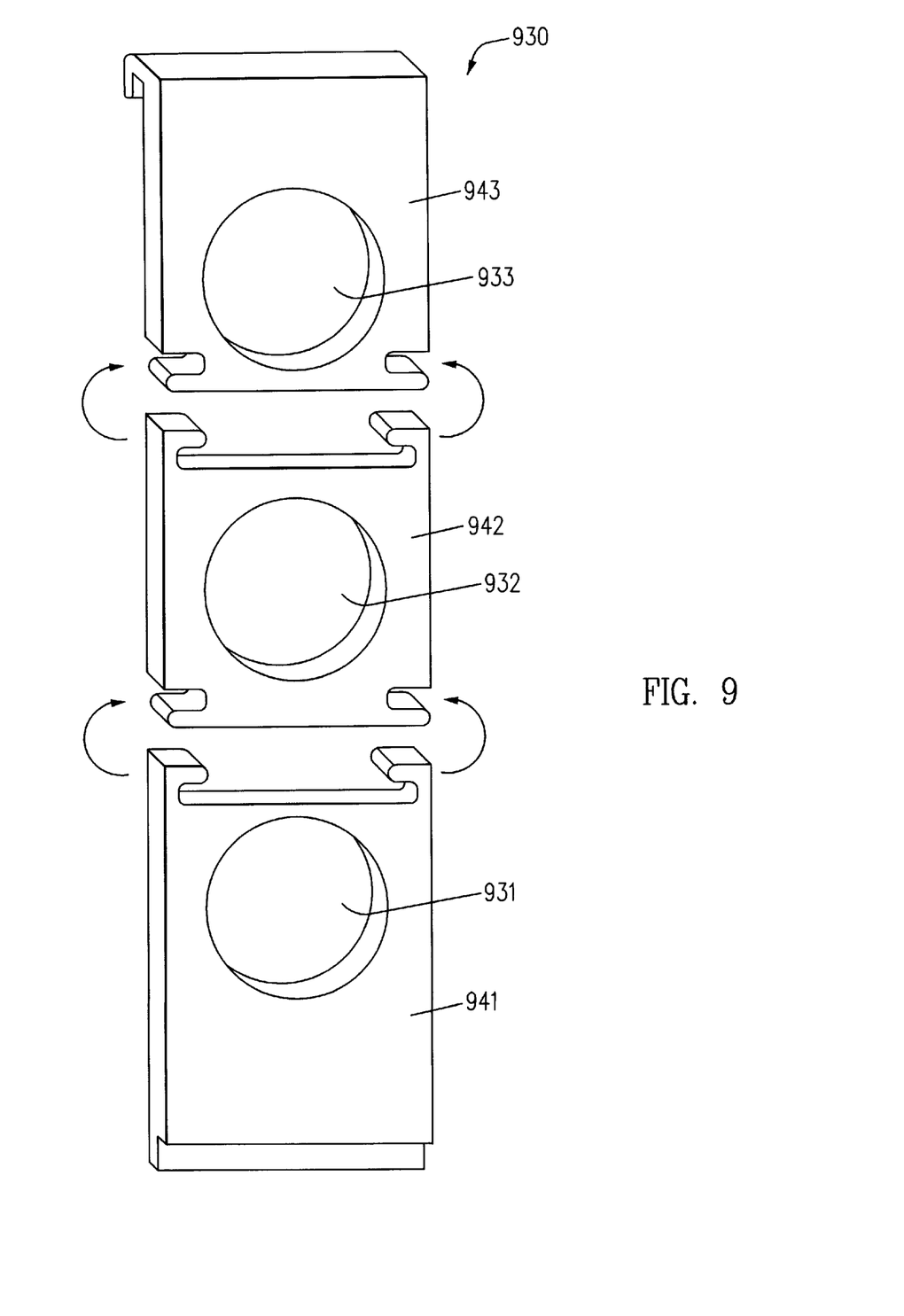
FIG. 9 is an illustration of one embodiment of a plurality of face pieces that are used to make one face slab of a RTP barrel reactor energy stabilizer with a plurality of face slabs.

In a final embodiment of the energy stabilizer of this invention, each face slab 930 is made of a plurality of interlocking pieces 941 to 943 that hang on a frame similar to that shown in FIG. 2A. Each interlocking piece 941 to 943 includes a pocket 931 to 933, respectively, to support a substrate. In addition, each of interlocking pieces 941 to 942 could include additional pockets to define substrate surround rings, and rims about the perimeter of the face as described above. Also, the interlocking pieces could include other interlock mechanisms, and/or alternatively have openings to mate with guide pins on the frame as in FIG. 2A.

Various embodiments of the RTP barrel reactor of this invention have been described. These embodiments are illustrative only and are not intended to limit the invention to the specific embodiments described. In view of this disclosure, those of skill the art can implement the features of this invention in a wide variety of ways.

I claim:

1. A rapid thermal process barrel reactor comprising:
   a structure having an interior volume comprising a RTP barrel reactor reaction chamber;
   a RTP barrel reactor energy stabilizer mounted within said RTP barrel reactor reaction chamber;
   a RTP barrel reactor radiant heat source mounted outside said RTP barrel reactor reaction chamber wherein radiant heat from said RTP barrel reactor radiant heat source directly heats said RTP barrel reactor energy stabilizer and any substrates supported thereon;
   a dual-mode RTP barrel reactor heat controller, coupled to said RTP barrel reactor radiant heat source, comprising:
   an open-loop controller wherein said open-loop controller is used during heat-up; and
   a closed-loop controller wherein said closed-loop controller is used during deposition of a film.

2. A rapid thermal process barrel reactor as in claim 1 wherein said RTP barrel reactor energy stabilizer further comprises:
   a frame having a plurality of open faces; and
   a plurality of energy stabilizer face slabs wherein a different one of said plurality of energy stabilizer face slabs is mounted on each of said plurality of open faces.

3. A rapid thermal process barrel reactor as in claim 2 wherein one of said energy stabilizer face slabs is a quartz energy stabilizer face slab.

4. A rapid thermal process barrel reactor as in claim 3 wherein a first surface of said quartz energy stabilizer face slab is bead-blasted.

5. A rapid thermal process barrel reactor as in claim 3 wherein quartz energy stabilizer face slab includes at least one pocket.

6. A rapid thermal process barrel reactor as in claim 5 further comprising a silicon carbide insert placed in said pocket.

7. A rapid thermal process barrel reactor as in claim 5 further comprising an insert having an outer edge surface and a maximum dimension less than a maximum dimension of said pocket.

8. A rapid thermal process barrel reactor as in claim 7 further comprising an outer ring placed in said pocket about said insert.

9. A rapid thermal process barrel reactor as in claim 7 wherein said insert has a depth less than said depth of said pocket.

10. A rapid thermal process barrel reactor as in claim 1 wherein said RTP barrel reactor energy stabilizer is a one piece low thermal mass energy stabilizer having an open bottom.

11. A rapid thermal process barrel reactor as in claim 1 wherein said RTP barrel reactor energy stabilizer includes a face slab comprising a plurality of interlocking pieces.

12. A rapid thermal process barrel reactor as in claim 1 wherein said RTP barrel reactor radiant heat source further comprises a plurality of lamp banks wherein each lamp bank includes a plurality of lamps.

13. A rapid thermal process barrel reactor as in claim 12 wherein said lamps comprise quartz-halogen lamps.

14. A rapid thermal process barrel reactor as in claim 13 wherein said quartz-halogen lamps have tungsten filaments.

15. A rapid thermal process barrel reactor as in claim 12 wherein each of said plurality of lamp banks includes 14 to 20 lamps.

16. A rapid thermal process barrel reactor as in claim 12 wherein said plurality of lamp banks in combination with said dual-mode RTP barrel reactor heat controller raises the temperature of each substrate in said plurality of substrates at a rate in a range of about 5° C. per second to about 20° C. per second.

17. A rapid thermal process barrel reactor as in claim 1 further comprising:
   a temperature sensor mounted within said RTP barrel reactor reaction chamber, and coupled to said dual-mode RTP barrel reactor heat controller.

18. A rapid thermal process barrel reactor as in claim 17 wherein said temperature sensor is a thermocouple.

19. A rapid thermal process barrel reactor as in claim 17 further comprising:
   another temperature sensor mounted within said RTP barrel reactor energy stabilizer, and coupled to said dual-mode RTP barrel reactor heat controller.

20. A rapid thermal process barrel reactor as in claim 19 wherein said another temperature sensor is a thermocouple.

21. A rapid thermal process barrel reactor as in claim 19 wherein said dual-mode RTP barrel reactor heat controller further comprises:
   a temperature mixer coupled to said temperature sensors.

22. A rapid thermal process barrel reactor as in claim 21 wherein said temperature mixer includes a preprogrammed ramp for use when said closed-loop controller is being used.

23. A rapid thermal process barrel reactor as in claim 21 wherein said dual-mode RTP barrel reactor heat controller further comprises:
   an automatic control selector coupled to said temperature mixer, to said open loop controller, and said closed loop controller, wherein said automatic control selector, in response to a predefined signal from said temperature mixer enables said closed loop controller for use, and disables said open loop controller.

24. A rapid thermal process barrel reactor as in claim 1 further comprising:
   a temperature sensor mounted within said RTP barrel reactor energy stabilizer, and coupled to said dual-mode RTP barrel reactor heat controller.

25. A method for rapid thermal processing a multiplicity of substrates in a RTP barrel reactor comprising:
   supporting at least one substrate on each face of a RTP barrel reactor energy stabilizer wherein said multiplicity of substrates are supported by said RTP barrel reactor energy stabilizer;
   heating said multiplicity of substrates during a heat-up phase using a heat source controlled by an open-loop controller; and
   heating said multiplicity of substrates during a deposition phase using said heat source controlled by a closed-loop controller.

26. A method for rapid thermal processing a multiplicity of substrates in a RTP barrel reactor as in claim 25 further comprising:
   adjusting an input temperature signal to said closed-loop controller using a preprogrammed temperature ramp.

27. A method for rapid thermal processing a multiplicity of substrates in a RTP barrel reactor as in claim 25 further comprising:
   switching control of said heat source from said open-loop controller to said closed loop controller upon a temperature signal having a predefined level.

* * * * *